(12) United States Patent
Peschke

(10) Patent No.: US 7,429,873 B2
(45) Date of Patent: Sep. 30, 2008

(54) HIGH VOLTAGE DIGITAL DRIVER WITH DYNAMICALLY BIASED CASCODE TRANSISTORS

(75) Inventor: Carlo Eberhard Peschke, Kirchheim/Teck (DE)

(73) Assignee: Dialog Semiconductor GmbH, Kirchheim/Teck (DE)

( * ) Notice: Subject to any disclaimer, the term of this patent is extended or adjusted under 35 U.S.C. 154(b) by 292 days.

(21) Appl. No.: 11/333,915

(22) Filed: Jan. 18, 2006

(65) Prior Publication Data

US 2007/0159373 A1    Jul. 12, 2007

(30) Foreign Application Priority Data

Jan. 10, 2006   (EP)   ................... 06392002

(51) Int. Cl.
*H03K 19/0175*   (2006.01)
(52) U.S. Cl. .......................... 326/81; 326/86
(58) Field of Classification Search .......... 326/68, 326/81, 86
See application file for complete search history.

(56) References Cited

U.S. PATENT DOCUMENTS 6,429,686 B1 * 8/2002 Nguyen ................ 326/86
6,580,291 B1 * 6/2003 Lutley ................... 326/81
2003/0189443 A1 * 10/2003 Kunz et al. ............ 326/81

OTHER PUBLICATIONS

"A High-Voltage Output Driver in a Standard 2.5V 0.25 μm cmos Technology", by Bert Serneels et al., Isscc 2004/Session 7/ TD : Sealing Trends/7.8, Solid-State Circuits Conf. 2004, Digest of Technical Papers, pp. 146-155,XP010722195.
"A 5.5 SOPA Line Driver in a Standard 1.2 V 0.13 μm cmos Technology," by Bert Serneels et al., Proceedings of ESSCIRC, Grenoble , France, 2005, XP-010854962,IEEE 2005, pp. 303-306.
"A High-Voltage Output Driver in a 2.5-V 0.25-μm CMOS Technology", by Bert Serneels et al., IEEE Jrnl. of Solid-State Circuits, vol. 40, No. 3, Mar. 2005, pp. 576-583.

* cited by examiner

*Primary Examiner*—Marvin M. Lateef
*Assistant Examiner*—Adam Houston
(74) *Attorney, Agent, or Firm*—Saile Ackerman LLC; Stephen B. Ackerman

(57) ABSTRACT

A high voltage digital output driver with dynamically biased cascode transistors is disclosed. The cascode transistors are dynamically self-biased via capacitors from the output voltage. The dynamic self-biasing doesn't require any switching means. The output-voltage can be increased by adding additional self-biased cascode transistors. The static current consumption in low-state for each individual driver on a same chip is minimal because only one resistor string consuming static current is required for all similar output drivers.

18 Claims, 3 Drawing Sheets

HIGH VOLTAGE DIGITAL DRIVER WITH DYNAMICALLY BIASED CASCODE TRANSISTORS

BACKGROUND OF THE INVENTION (1) Field of the Invention

This invention relates generally to output drivers, and more particularly to high voltage digital output drivers.

(2) Description of the Prior Art

The growing integration density of VLSI circuits and the low-power requirements of complex signal processing applications, drives the use of deep-submicron technologies in modern IC's. Since these technologies imply low supply voltages, the design of high efficient power amplifiers and line drivers becomes extremely difficult in standard CMOS.

It is therefore a challenge to design a reliable and efficient high voltage output driver in standard CMOS technology on a single IC. In prior art different technologies such as smart power and various Bipolar-CMOS-DMOS (BCD) processes have been developed to solve the conflict of reducing voltages due to technology feature size with the requirements for operation at continued relatively high voltages. However the additional technology steps become rather expensive compared with a basic CMOS process.

There are various solutions known to address

Bert Serneels et al. ("A high voltage output driver in a 2.5 V 0.25 µm CMOS technology", IEEE Journal of Solid-State Circuits, Vol. 40, No. 3, March 2005) describe the design of a high-voltage output driver in a digital 2.5 V 0.25 µm CMOS technology. The use of stacked devices with a self-biased cascade topology allows the driver to operate at three times the nominal supply voltage.

U.S. Patent Application Publication (2003/0189443 to Kunz et al.) proposes an output driver architecture that uses thin gate-oxide core and thin gate-oxide Drain-extended transistors that can directly interface with voltage supplies up to six times the normal rating of the transistor. A bias generator, level shifter and output stage are adapted to buffer an input signal with a voltage swing of less than the normal operating voltage of the transistors to an output signal with a voltage swing of up to approximately six times the normal operating voltage of the transistors. The bias generator is interfaced directly with a high voltage power supply and generates a bias voltage with a magnitude of less than the dielectric breakdown of the transistors internal to the level shifter and output stage. Further, the bias generator is adapted to sense the magnitude of the high voltage supply, and to automatically and continuously self-adjust the bias voltage in response to changes sensed in the magnitude of the high voltage supply such that the bias generator can be used for a continuous range of high voltage supplies up to 6 times the normal operating voltage of the transistors.

U.S. patent (U.S. Pat. No. 6,580,291 to Lutley) discloses an apparatus comprising a first circuit configured to generate a first portion of an output signal in response to (i) a first supply voltage and (ii) a pull-up signal and a second circuit configured to generate a second portion of said output signal in response to (i) a second supply voltage and (ii) a pulldown signal, wherein said first and second circuits are implemented with transistors that normally can only withstand said second supply voltage.

U.S. patent (U.S. Pat. No. 6,429,686 to Nguyen) discloses an output driver on an integrated circuit (IC) including at least one transistor that has a thicker gate oxide than other standard transistors in the IC. In one embodiment, the output driver includes two pull-up transistors. A first pull-up transistor has a thicker gate oxide than standard transistors on the IC to provide a wide range of output voltages on the pad. A second pull-up transistor has a standard, i.e. thin, gate oxide thickness to ensure a fast low-to-high voltage transition on the pad. The other transistors in the output driver have standard gate oxide thicknesses. Illustrative thicknesses include 150 Angstroms for the first pull-up transistor and 50 Angstroms for the second pull-up transistor.

SUMMARY OF THE INVENTION

A principal object of the present invention is to achieve a high voltage output driver having minimal static current consumption in low output voltage state.

Another object of the invention is to achieve a high-voltage output driver requiring only a single well process with an extended drain high-voltage NMOS transistor.

In accordance with the objects of this invention a circuit for a digital integrated output driver with dynamically biased cascode transistors has been achieved. This circuit comprises, first, a level-shifter, having an input and an output, wherein said input is connected to an input of said output driver and said output is connected to a gate of a first transistor of a string of any number n cascoded PMOS transistors. Furthermore the circuit invented comprises said string of n cascoded PMOS transistors, wherein a source of said first PMOS transistor is connected to VDD voltage, the drain of each transistor is connected to a source of a next transistor and the drain of the nth transistor is connected to an output of said output driver, and wherein all said transistors, except said first and a second transistor, are dynamically biased by said output voltage via a biasing means. Moreover the circuit comprises an NMOS high-voltage output transistor, wherein its drain is connected to said output of said output driver, its gate is connected to the input of the output driver, and its source is connected to ground voltage. Finally the circuit comprises a string of n resistive means, wherein a first terminal of a first resistive means is connected to VDD voltage and a second terminal of the nth resistive means is connected to ground, wherein a tap between said first resistive means and a second resistive means is connected to the gate of said second transistor of said string of n cascoded transistors, a tap between said second resistive means and a third resistive means is connected via a rectifying means to a gate of a third transistor of said string of n cascoded transistors and, if n is greater than three, each following tap between neighboring resistive means is connected via a rectifying means to a gate of a correspondent transistor of said string of n cascoded PMOS transistors. Finally the circuit comprises said (n−2) rectifying means, wherein each of the rectifying means connects one of the last (n−2) taps between said n resistive means with a correspondent gate of the last (n−2) transistors of said string of n cascoded PMOS transistors.

In accordance with the objects of this invention a method to achieve a digital output driver has been achieved. The method invented comprises, first, the provision of a level shifter, an NMOS high voltage output transistor, a string of more than two cascoded PMOS transistors, and a biasing means. Each cascode transistor works as a source follower limiting the drain potential of the one above it (e.g. P1 defines the drain potential of P0) so that neither drain-gate nor source-gate voltage of the transistor above (in this example: P0) exceeds the maximum allowable voltage of the oxide. Further steps of the method are to control by an input signal via said level-shifter the gate of a first transistor of said string of PMOS transistors, which is the closest to VDD voltage, and directly the gate of said NMOS output transistor, and to set the gate voltage of a second transistor next to said first transistor of the transistor string to the supply voltage VDD minus its maximum oxide voltage. The last two steps of the method are to set the gate voltages of all transistors of said string of transistors, except said first and second transistor, to a value they can withstand during a low output state, and to bias dynamically the gate voltages of all transistors of said string of transistors, except said first and second transistor, from the output voltage of said output driver using said biasing means.

BRIEF DESCRIPTION OF THE DRAWINGS

In the accompanying drawings forming a material part of this description, there is shown.

DESCRIPTION OF THE PREFERRED EMBODIMENTS

The preferred embodiments of the present invention disclose novel circuits and methods for high-voltage digital output drivers which can be manufactured with a single well process with an extended drain high-voltage transistor. Furthermore the present invention teaches high-voltage output drivers having a minimal static current consumption in low-voltage state.

Figure 1:
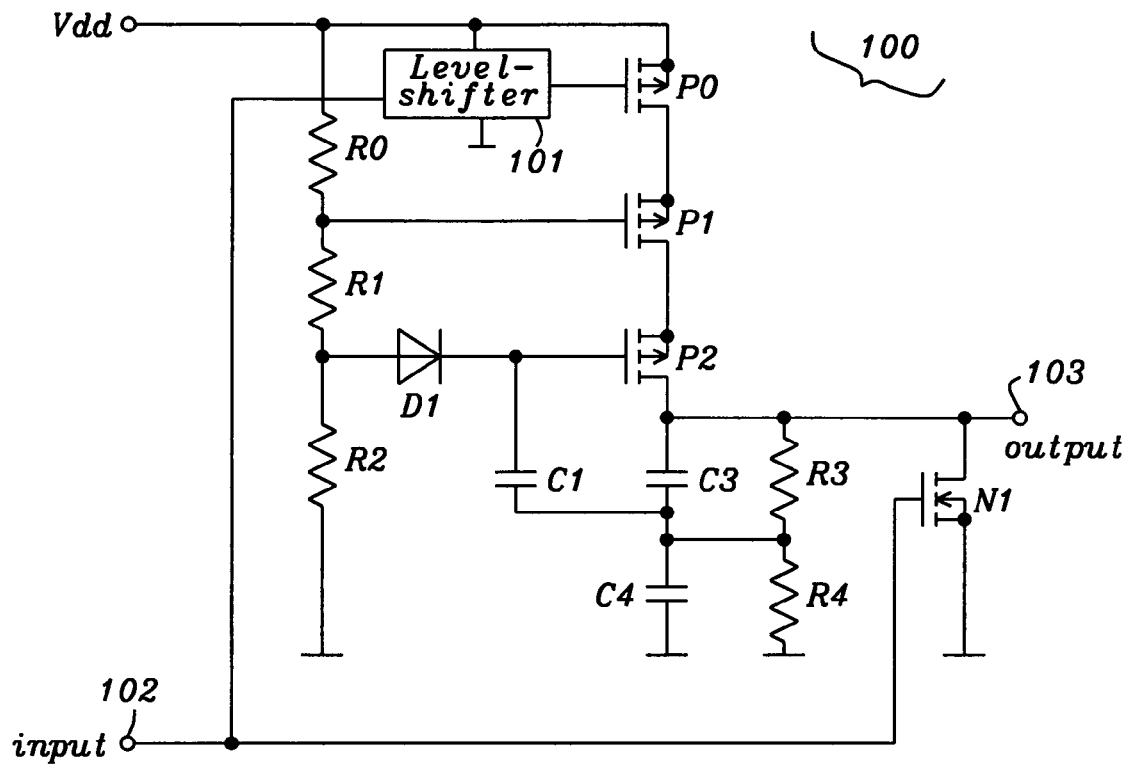
FIG. 1 shows a circuit schematic of a preferred embodiment of the present invention having wherein the maximum oxide voltage of transistors P0-P2 is a third of Vdd voltage.

FIG. 1 shows a circuit schematic of a preferred embodiment of the present invention. This high-voltage output driver 100 comprises a high-voltage NMOS enhancement mode output transistor N1 having an extended drain. This high-voltage output transistor N1 must be able to withstand high-voltage VDD between drain and gate.

All transistors of the preferred embodiment are as a non-limiting example enhancement type transistors. Other types of transistors are also possible. Alternatively e.g. transistors P2 and P3 could be depletion type as well.

The input voltage 102 is pushed up by level shifter 101. The output of level-shifter 101 controls the gate of PMOS transistor P0. In a preferred embodiment this level-shifter is implemented by a current that is fed into a resistor, which is between the gate of P0 and VDD voltage. This level shifter configuration only consumes current when the output is high. This current of the level-shifter is switched on and off with a high-voltage transistor (the same type as high-voltage output transistor N1). The circuit of the present invention defines the gate voltage of transistor P0 very well and hence the current through this resistor is well-defined too.

Alternatively, instead of a resistor at the gate of P0 a non-linear structure, e.g. some diodes in series can be used to limit the gate voltage of P0. In this case the gate voltage of P0 depends on the threshold of those diodes The temperature dependency of the threshold voltage and the switching speed may cause some problems. It is also possible to put a single PMOS-diode there that forms a current mirror together with P0. This is a good solution if the output current in high-state should be well defined but the switching speed is limited also.

The PMOS enhancement mode transistor P0 is the high-side switch of the output driver 100.

P0, P1 and P2 are cascoded transistors that divide the high voltage VDD into a voltage that those transistors P0-P2 can withstand. Each cascode transistor works as a source follower limiting the drain potential of the transistor being closer to VDD voltage, e.g. transistor P1 defines the drain potential of transistor P0 and transistor P2 defines the drain potential of transistor P1. Resistors R0, R1 and R2 form a resistor string to bias the gate voltages of transistors P1 and P2 if the output voltage 103 is low. The gate voltage of P1 is the supply voltage VDD minus the maximum oxide voltage. The tap between resistors R1 and R2 provides via diode D1 the gate voltage of transistor P2 in the case that the output voltage 103 is low and charges capacitor C1. The gate voltage of P2 is about VDD voltage minus two times the maximum oxide voltage of transistor P2.

The resistor string R0, R1 and R2 can be shared between all output drivers of a similar type as the present invention on the same chip.

Resistors R3 and R4 define the gate voltage of P2 via capacitor C1 in case the output voltage 103 is high. In this high state the gate voltage of P2 needs to be the $V_{DD}$ voltage minus the maximum oxide voltage of P2.

Capacitors C3 and C4 are only required if the resistance of R3 and R4 is so high that the time constant of R3 parallel to R4 together with C1 is shorter than the rise and fall time at the output port 103. Resistors R3 and R4 cannot be omitted because they are needed to define the DC point between C3 and C4 or a DC-point for capacitor C1 if C3 and C4 are not required.

The maximum gate-voltage of the cascaded transistors of the preferred embodiment shown in FIG. 1 as a non-limiting example is 5 Volts. The maximum voltage of the output driver of the present invention cannot be higher than the number of cascaded PMOS transistors times their maximum gate-voltage. This means the theoretical maximum voltage of the embodiment of the output driver of FIG. 1 having 3 cascoded transistors is 15 Volts. Since spikes occur during switching the maximum voltage that can be achieved in reality is lower, as e.g. 13.5 V in this preferred embodiment. In case a higher voltage is required either an additional cascoded transistor has to be added (see FIG. 3) or cascoded transistors with a higher maximum gate-voltage have to be used. It is obvious that the maximum drain-gate voltage of the pass transistor N1 limits the maximum voltage of the output driver as well.

The highest voltage of 3 times the maximum gate voltage can only be achieved if all overshoot voltages at the gates during transition of the output are compensated by capacitors.

Another reason that the theoretical limit of 3 times the maximum gate voltage cannot be reached are tolerances in device parameters.

Key points of the embodiment of the present invention shown in FIG. 1 are that P2 is biased from the output voltage via capacitors C3, C4 and C1 and not, as in prior art, via a resistor string from the output to VDD voltage and that no switching is required to provide biasing.

Figure 2:
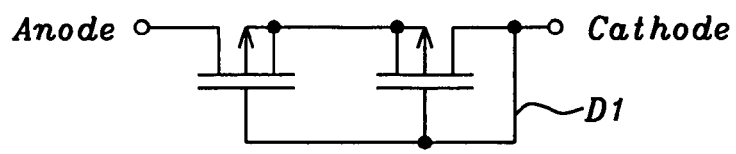
FIG. 2 illustrates a preferred embodiment of rectifying means D1 shown in FIG. 1.

FIG. 2 shows a preferred implementation of the rectifying means D1 shown in FIG. 1. D1 has been implemented using two MOS diodes in series. Alternatively a junction diode could be used for the rectifying means D1 shown in FIG. 1 as well.

Figure 3:
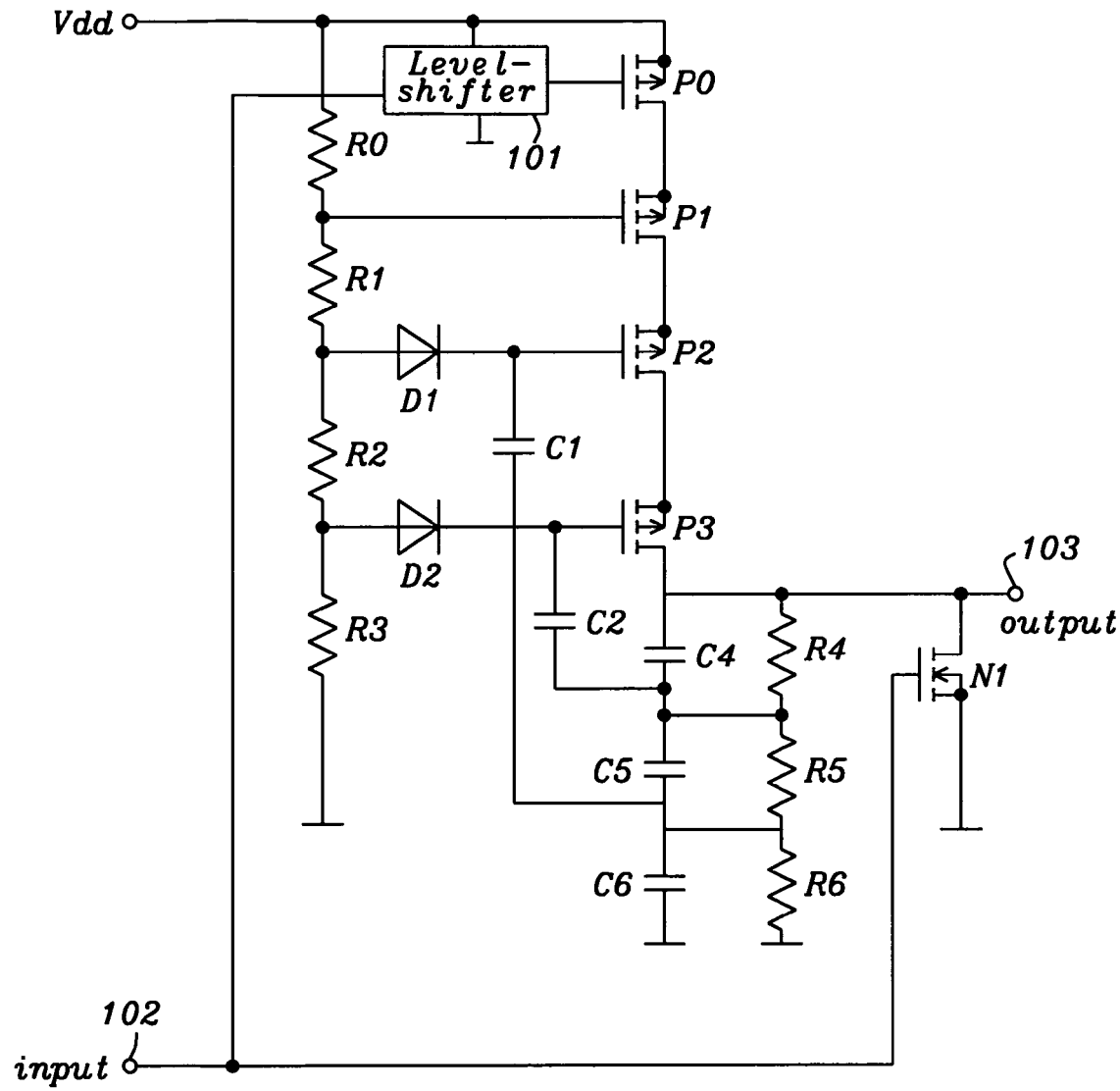
FIG. 3 shows a circuit schematic of a preferred embodiment of the present invention having wherein the maximum oxide voltage of transistors P0-P3 is a fourth of Vdd voltage.

FIG. 3 shows another preferred embodiment of the present invention having a higher output voltage than the circuit of FIG. 1. As already mentioned above the maximum output voltage of the output driver can be increased by adding additional cascoded transistors. Compared to the embodiment shown in FIG. 1 the circuit of FIG. 3 comprises an additional cascode transistor P3, an additional resistor R6, additional capacitors C2 and C6, and an additional diode D2. The gate voltage of P1 is the supply voltage V<sub>DD</sub> minus the maximum oxide voltage, The tap between resistors R1 and R2 provides via diode D1 the gate voltage of transistor P2 for the case that the output voltage 103 is low and charges capacitor C1. The tap between resistors R2 and R3 provides via diode D2 the gate voltage of transistor P3 for the case that the output voltage 103 is low and charges capacitor C2.

Key points of the embodiment of the present invention shown in FIG. 3 are that cascode transistors P2 and P3 are biased from the output voltage 103 if output voltage 103 is high. Cascode transistor P2 is biased from the output voltage 103 via capacitor string C4-C6 and capacitor C1 and cascode transistor P3 is biased from the output voltage via capacitor string C4-C6 and capacitor C2.

Figure 4:
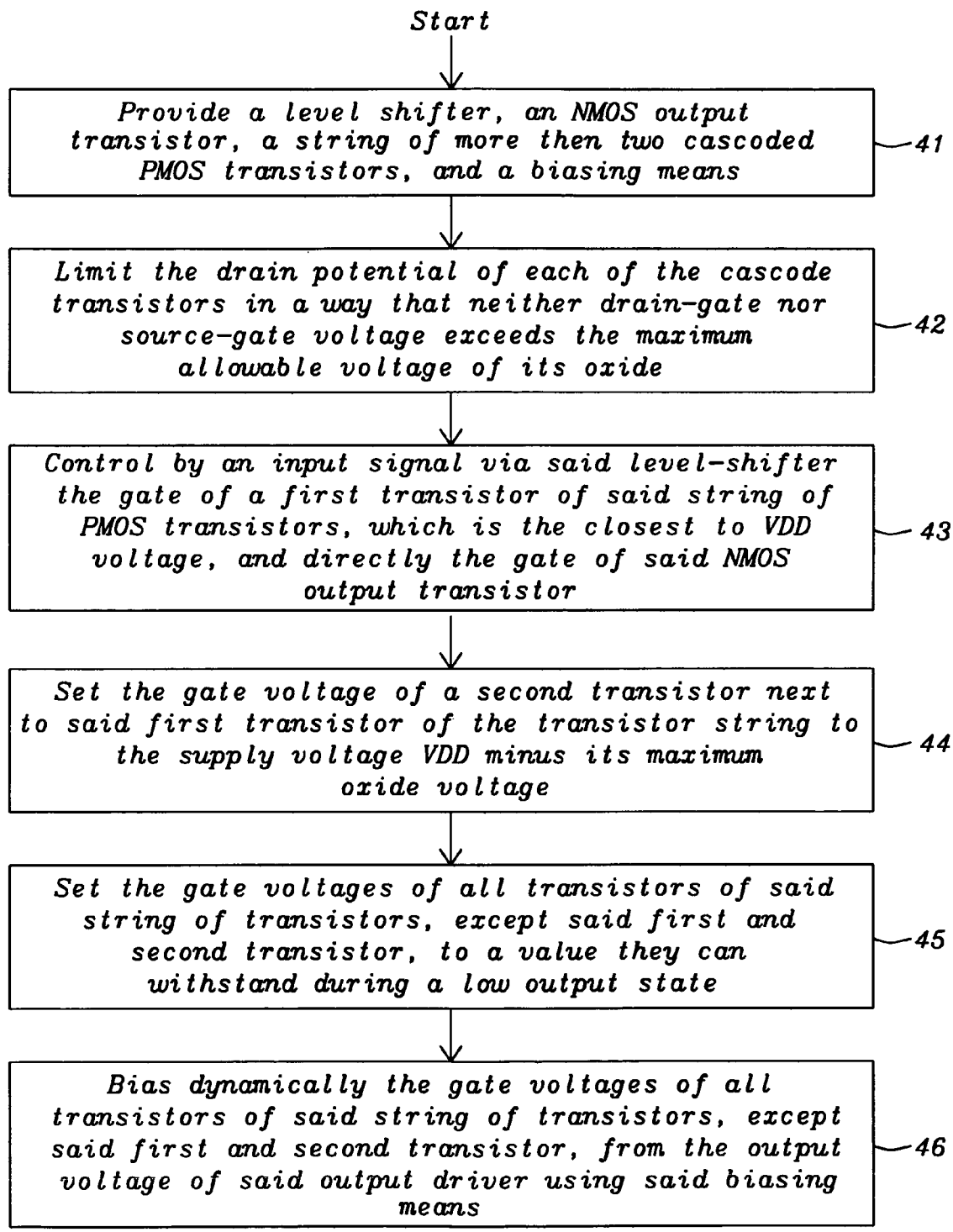
FIG. 4 describes a flowchart of a method to achieve a high-voltage output driver.

FIG. 4 describes a flowchart of a method to achieve a high-voltage digital output driver. A first step 41 teaches the provision of a level shifter, an NMOS output transistor, a string of more than two cascoded PMOS transistors, and a biasing means. The following step 42 shows the prevention of an excessive voltage of the NMOS output transistor by protecting its by said string of transistors between VDD voltage and its source during a low output state, wherein said string of transistors divides VDD voltage into voltages they can withstand. The following step 43 discloses the control by an put signal via said level-shifter the gate of a first transistor of said string of PMOS transistors, which is the closest to VDD voltage, and directly the gate of said NMOS output. The next step 44 teaches to set the gate voltage of a second transistor next to said first transistor of the transistor string to the supply voltage VDD minus its maximum voltage. In step 45 the gate voltages of all transistors of said string of transistors, except said first and second transistor, are set to a value they can withstand during a low output state. In the last step 46 the gate voltages of all transistors of said transistor string, except said first and second transistor, are biased dynamically from the output voltage of said output driver using said biasing means.

It has to be understood that 4, 5 or even more cascoded transistors can be used if higher voltages are required. This means that in case of four cascoded transistors three of them will be biased from the output voltage, in case of five cascoded transistors four of them will be biased from the output voltage, etc.

While the invention has been particularly shown and described with reference to the preferred embodiments thereof, it will be understood by those skilled in the art that various changes in form and details may be made without departing from the spirit and scope of the invention.

What is claimed is:

1. A circuit of a digital integrated output driver with dynamically biased cascade transistors is comprising:
    a level-shifter having an input and an output, wherein said input is connected to an input of said output driver and said output is connected to a gate of a first transistor of a string of any number n cascaded PMOS transistors, wherein n is more than 2;
    said string of any number n cascaded PMOS transistors, wherein n is more than 2 and wherein a source of said first PMOS transistor is connected to VDD voltage, the drain of each transistor is connected to a source of a next transistor and the drain of the nth transistor is connected to an output of said output driver, and wherein all said transistors, except said first and a second transistor, are dynamically biased by said output voltage via a biasing means;
    said biasing means, wherein said biasing means is driven from an output voltage of said output driver and does not require any switching;
    an NMOS output transistor, wherein its drain is connected to said output of said output driver, its gate is connected to the input of the output driver, and its source is connected to ground voltage;
    a string of n resistive means, wherein a first terminal of a first resistive means is connected to VDD voltage and a second terminal of the nth resistive means is connected to ground, wherein a tap between said first resistive means and a second resistive means is connected to the gate of said second transistor of said string of n cascoded transistors, a tap between said second resistive means and a third resistive means is connected via a rectifying means to a gate of a third transistor of said string of n cascaded transistors and, if n is greater than three, each following tap between neighboring resistive means is connected via a rectifying means to a gate of a correspondent transistor of said string of n cascoded PMOS transistors; and
    said (n–2) rectifying means, wherein each of the rectifying means connects one of the last (n–2) taps between said n resistive means with a correspondent gate of the last (n–2) transistors of said string of n cascoded PMOS transistors.

2. The circuit of claim 1 wherein said string of n resistive means comprises n resistors.

3. The circuit of claim 1 wherein said string of n resistive means provides gate voltages for PMOS cascoded transistors of other output drivers on a same chip.

4. The circuit of claim 1 wherein two MOS diodes in series are used for each of said (n–2) rectifying means.

5. The circuit of claim 1 wherein a junction diode is used for each of said (n–2) rectifying means.

6. The circuit of claim 1 wherein each of said cascode transistors works as a source follower limiting the drain potential of the cascode transistor which is closer to VDD voltage.

7. The circuit of claim 1 wherein said level shifter is implemented by a current fed into a resistor located between the gate of said first cascoded PMOS transistor and VDD voltage and said current is switched on and off by a transistor.

8. The circuit of claim 1 wherein said level shifter is implemented by a current fed into a number of diodes in series located between the gate of said first cascaded PMOS transistor and VDD voltage and said current is switched on and off by a transistor.

9. The circuit of claim 1 wherein said level shifter is implemented by a current fed into a single diode located between the gate of said first cascoded PMOS transistor and VDD voltage and said current is switched on and off by a transistor.

10. The circuit of claim 1 wherein all transistors used are enhancement type transistors.

11. The circuit of claim 1 wherein said biasing means are comprising
    a string of (n–1) resistive means being connected between the source of said NMOS output transistor and ground, wherein a first of said (n–1) resistive means is connected with a terminal to the source of the output transistor and the last of the (n–1) resistive means is connected with a terminal to ground;
    (n–2) capacitors, wherein a first terminal of a first capacitor is connected to a tap between said first of (n–1) resistive means and a second of said (n–1) resistive means and a second terminal of said first capacitor is connected to a gate of said last transistor of said string of n cascoded transistors, if n is greater than three, a first terminal of a second capacitor is connected to a tap between a second of (n−1) resistive means and a third of said (n−1) resistive means and a second terminal of said second capacitor is connected to a gate of a (n−1)th transistor of said string of n cascoded transistors until a first terminal of a last of said (n−2) capacitors is connected to a tap between a (n−2)th of said (n−1) resistive means and said last of said (n−1) resistive means and a second terminal of said last of (n−2) capacitor is connected to a gate of a (n−1)th transistor of said string of n cascoded transistors.

12. The circuit of claim 11 wherein a string of (n−1) capacitors is added in parallel to said string of (n−1) resistive means, wherein each tap between these (n−1) capacitors is connected to a correspondent tap between said (n−1) resistive means.

13. The circuit of claim 11 wherein said string of (n−1) resistive means comprises (n−1) resistors.

14. The circuit of claim 11 wherein said string of (n−1) resistive means comprises (n−1) transistors.

15. A method to use a digital output driver comprises the following steps:
provide a level shifter, an NMOS output transistor, a string of more than two cascoded PMOS transistors, and a biasing means;
limit the drain potential of each of of said cascaded transistors in a way that neither their drain-gate nor source gate voltage exceeds the maximum allowable voltage of their oxide;
control by an input signal via said level-shifter the gate of a first transistor of said string of PMOS transistors, wherein said first transistor has its source directly connected to VDD voltage, wherein said input signal also directly controls the gate of said NMOS output transistor;
set the gate voltage of a second transistor next to said first transistor of the transistor string to the supply voltage VDD minus its maximum oxide voltage;
set the gate voltages of all transistors of said string of transistors, except said is first and second transistor, to a value they can withstand during a low output state; and
bias dynamically the gate voltages of all transistors of said string of transistors, except said first and second transistor, from the output voltage of said output driver using said biasing means.

16. The method of claim 14 wherein the gate voltage of all but the first transistors of said string of cascaded PMOS transistors is set using a string of resistive means.

17. The method of claim 14 wherein said biasing means does not require any switching means.

18. The method of claim 14 wherein said limitation of the drain potential of each of said cascaded transistors is achieved by implementing each of the cascoded transistors as a source follower wherein each of the cascoded transistors is limiting the drain potential of the cascoded transistor being closer to VDD voltage.

* * * * *

UNITED STATES PATENT AND TRADEMARK OFFICE
CERTIFICATE OF CORRECTION

PATENT NO. : 7,429,873 B2  Page 1 of 1
APPLICATION NO. : 11/333915
DATED : September 30, 2008
INVENTOR(S) : Carlo Peschke It is certified that error appears in the above-identified patent and that said Letters Patent is hereby corrected as shown below:

On the Title Page, Item (73) delete "Dialog Semiconductor GmbH, Kirchhein/Teck (DE)" and replace with -- Dialog Semiconductor GmbH, Kirchheim/Teck-Nabern (DE) --.

Signed and Sealed this

Twenty-eighth Day of April, 2009

JOHN DOLL
*Acting Director of the United States Patent and Trademark Office*